United States Patent
Jang

(10) Patent No.: US 6,714,465 B2
(45) Date of Patent: Mar. 30, 2004

(54) MEMORY DEVICE AND PROCESS FOR IMPROVING THE STATE OF A TERMINATION

(75) Inventor: Seong-jin Jang, Sungnam (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 10/272,944

(22) Filed: Oct. 18, 2002

(65) Prior Publication Data

US 2003/0076712 A1 Apr. 24, 2003

(30) Foreign Application Priority Data

Oct. 23, 2001 (KR) ........................................ 2001-65447

(51) Int. Cl.[7] .............................................. G11C 7/00
(52) U.S. Cl. .................................. 365/194; 365/189.07
(58) Field of Search .............................. 365/194, 222, 365/226, 233, 239, 189, 189.07, 100, 189.02

(56) References Cited

U.S. PATENT DOCUMENTS 6,133,773 A * 10/2000 Garlepp et al. ............. 327/247
6,549,154 B2 * 4/2003 Isobe et al. ................. 341/144
2002/0008558 A1 * 1/2002 Okuda et al. ............... 327/175

* cited by examiner

Primary Examiner—Thong Q. Le
(74) Attorney, Agent, or Firm—Harness, Dickey & Pierce, P.L.C.

(57) ABSTRACT

A memory device and process for improving the state of one or more terminations according to process, voltage, and/or temperature variations, including a delay looped circuit (DLL). The memory device has one or more terminations to which one or more variable resistance circuits are connected and through which one or more external signals are passed for operating the memory device, and a control circuit for generating a control signal for controlling one or more resistance values of the variable resistance circuits, in response to a command enable signal that represents the activation of another operation and an external enable signal that activates the DLL in the memory device. After the state of the one or more terminations is improved by the control signal, the DLL is enabled. External signals can be received after improving the state of the terminations according to process, voltage, and/or temperature variations, thereby improving input/output characteristics.

11 Claims, 4 Drawing Sheets

(IN CASE tCAL < tRFC)

(IN CASE tCAL < tRFC)

MEMORY DEVICE AND PROCESS FOR IMPROVING THE STATE OF A TERMINATION

BACKGROUND OF THE INVENTION

1. Field of the Invention

The present invention relates to a memory device and process, and more particularly, to a memory device and process for improving the state of one or more terminations in response to process, voltage, and/or temperature variations.

2. Description of the Related Art

A memory device may be connected to an external system, such as a memory controller, through a channel. Signals input from the external system to the memory device through the channel may contain noise, which is caused by a reflected wave. The noise may corrupt the input signal due to the impedance mismatching of the channel. A resistance may be connected to a termination of the memory, to which the input signal is applied, to reduce the noise of the input signal by reducing the reflected wave, thereby improving the state of the termination in the memory device.

For a conventional memory device operated at low speed, the resistance of the termination may be adjusted with a fuse to improve the state of the termination in the memory device and correct process variations. However, the conventional memory device does not vary the resistance value of the termination in the memory device according to variations in voltage or temperature, thereby deteriorating the input/output characteristics of a conventional memory device operated at a high speed.

SUMMARY OF THE INVENTION

In exemplary embodiments, the present invention provides a memory device and process for improving the state of terminations by varying a resistance value connected to the terminations, according to process, voltage, and/or temperature variations.

In an exemplary embodiment of the present invention, a delay locked-loop circuit (DLL) is included in the memory device. The memory device, in an exemplary embodiment, also includes at least one termination, to each of which a variable resistance circuit is connected and through which at least one external signal is passed for operating the memory device and a control circuit for generating a control signal for controlling a resistance value of each of the variable resistance circuits, in response to a command enable signal that represents the activation of an another operation, such as an auto refresh operation, and an external enable signal that activates the DLL in the memory device. After the state of the terminations is improved by the control signal, the DLL is enabled. While the memory device periodically performs the other operation (for example, the auto refresh operation), the state of the terminations is improved by the control signal.

In another exemplary embodiment, the control circuit may include a comparison circuit for generating a control signal by comparing a resistance value of one or more of the variable resistance circuits with an external reference resistance value that is a reference for improving the state of the at least one terminations, and for generating a completion signal after the comparison; a latch circuit for latching the control signal so as to generate a latched control signal in response to an update signal; and a calibration circuit for generating a first internal enable signal to enable the comparison circuit in response to the external enable signal and the command enable signal, for generating the update signal after receiving the completion signal, and for generating a second internal enable signal to activate the DLL after generating the control signal.

In another exemplary embodiment, if a calibration time required for improving the state of the at least one terminations by the control signal is less than a refresh time for the auto refresh operation, the state of the terminations is improved within the refresh time. In another exemplary embodiment, if the calibration time is longer than the refresh time, the comparison circuit is enabled while performing a first auto refresh operation of the auto refresh operation, thereby improving the state of the terminations while performing a second automatic refresh operation performed after the first automatic refresh operation.

In another exemplary embodiment, any or all of the variable resistance circuits may include a first variable resistance connected to an external source voltage, where the first variable resistance may be modified to approach or match an external reference resistance value in response to the control signal; and a second variable resistance connected to a ground voltage, where the second variable resistance may also be modified to approach or match the external reference resistance value in response to the control signal.

In another exemplary embodiment, the present invention is directed to a process for improving the state of at least one termination in a memory device comprising generating a control signal for controlling at least one resistance value of at least one variable resistance circuit, in response to a command enable signal that represents the activation of another operation, such as an auto refresh operation, and an external enable signal that activates a delay locked-loop circuit (DLL) in the memory device; and improving the state of the at least one termination in the memory device based on the control signal; wherein the DLL is enabled after the state of the at least one termination is improved by the control signal, and the state of the at least one termination is improved by the control signal while the memory device periodically performs the another operation (for example, the auto refresh operation).

In another exemplary embodiment, generating the control signal includes comparing the at least one resistance value of the at least one variable resistance circuit with an external reference resistance value that is a reference for improving the state of the at least one termination, generating a completion signal after comparing, latching the control signal to generate a latched control signal in response to an update signal and generating a first internal enable signal to enable the comparison circuit in response to the external enable signal and the command enable signal, generating the update signal after receiving the completion signal, and generating a second internal enable signal to activate the DLL after generating the control signal.

In another exemplary embodiment, if a calibration time required for improving the state of the at least one termination by the control signal is less than a refresh time for the auto refresh operation, the state of the at least one termination is improved within the refresh time, and if the calibration time is longer than the refresh time, the comparison is enabled while performing a first auto refresh operation of the auto refresh operation, thereby improving the state of the at least one termination while performing a second auto refresh operation performed after the first auto refresh operation.

In another exemplary embodiment, the at least one variable resistance circuit includes at least two variable resistances, and the improving includes modifying a value of the first variable resistance, connected to an external source voltage, to approach or match an external reference resistance value in response to the control signal; and modifying a second variable resistance, connected to a ground voltage, to approach or match the external reference resistance value in response to the control signal.

In other exemplary embodiments, the state of the at least one termination is optimized by the control signal while the memory device periodically performs the another operation.

In another exemplary embodiment, the memory device and process according to the present invention receives external signals after improving the state of the terminations according to process, voltage, and/or temperature variations, thereby improving input/output characteristics of the memory device. In other exemplary embodiments, the state of the terminations is improved by an existing command, thereby improving the performance of the memory device. Additionally, the memory device and process according to one or more exemplary embodiments of the present invention are suitable for operating at a high speed.

BRIEF DESCRIPTION OF THE DRAWINGS

The present invention will become more apparent by describing in detail several exemplary embodiments thereof with reference to the attached drawings in which.

DETAILED DESCRIPTION OF THE INVENTION

Figure 1:
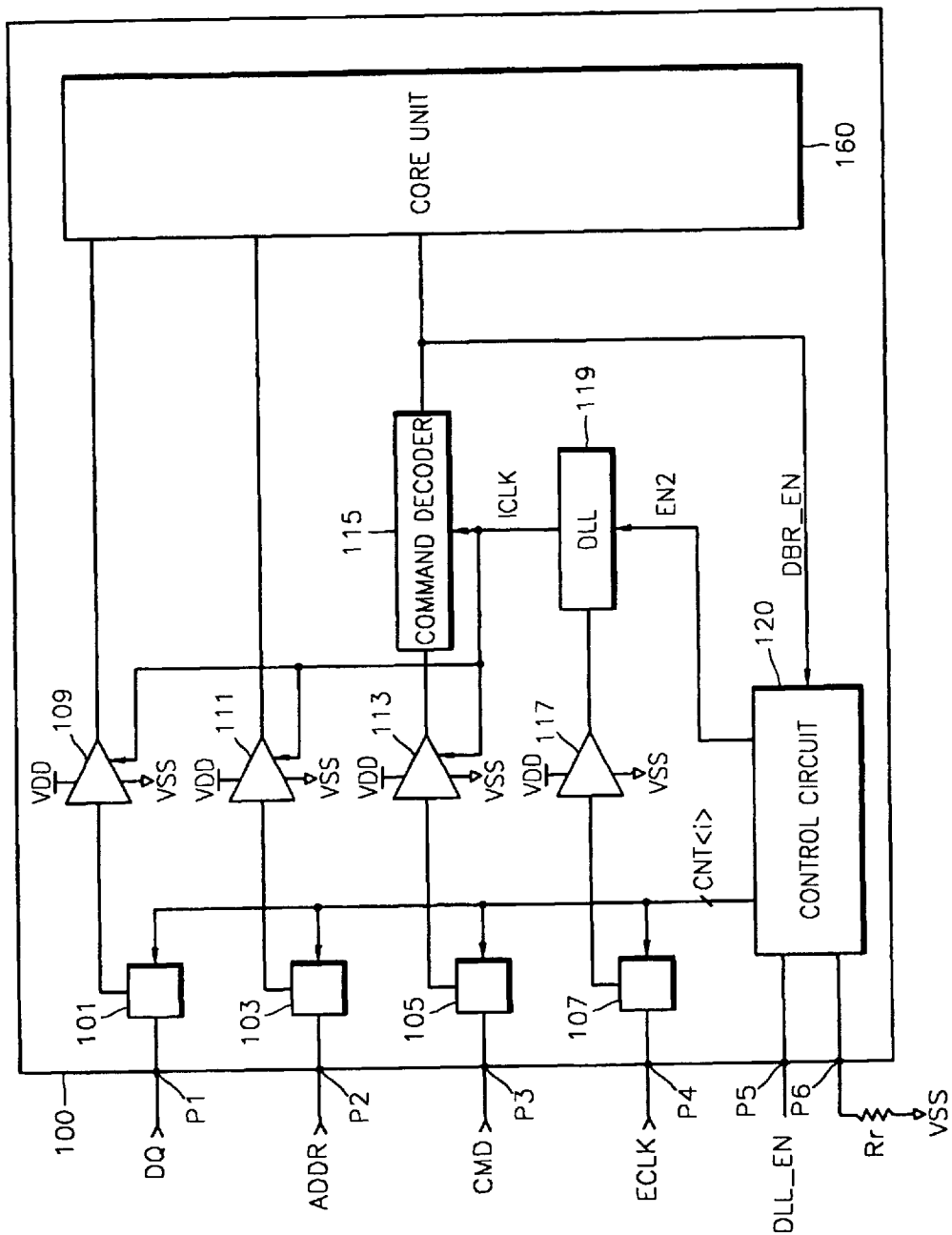
FIG. 1 is a block diagram illustrating a memory device according to an exemplary embodiment of the present invention.

The present invention now will be described more fully with reference to the accompanying drawings, in which exemplary embodiments of the present invention are shown. The same reference numerals in different drawings represent the same element.

FIG. 1 is a block diagram illustrating a memory device 100 according to an exemplary embodiment of the present invention. Referring to FIG. 1, the memory device 100 of the present invention includes at least one variable resistance circuit 101, 103, 105, and 107, at least one input buffer 109, 111, 113, and 117, a command decoder 115, a delay locked-loop circuit (DLL) 119, a control circuit 120, and a core unit 160.

External signals DQ, ADDR, CMD, ECLK, and DLL_EN may be applied through terminations P1, P2, P3, P4, and P5 for operating the memory device 100, respectively, and the terminations P1, P2, P3, P4, and P5 are connected to a channel (not shown), which is further connected to an external system (also not shown). For example, the external signal DQ may represent an input/output data signal, and the external signal ADDR may represent a signal for selecting a memory cell included in the core unit 160. The external signal CMD may represent an external command signal for controlling the operation of the memory device 100, and the external signal ECLK may represent an external clock signal. The external signal DLL_EN may represent an external enable signal for enabling the DLL 119. An external reference resistance Rr, which is a reference for improving the state of the channel, is connected to a termination P6 at one end while connected to a ground voltage VSS at the other end. The external reference resistance Rr may be arranged external to the memory device 100.

The input buffers 109, 111, 113, and 117 buffer the external signals DQ, ADDR, CMD, and ECLK, respectively. External source voltages VDD and the ground voltages VSS are applied to each input buffer 109, 111, 113, and 117.

The command decoder 115 applies a decoded external command signal CMD to the core unit 160.

The DLL 119 generates an internal clock signal ICLK that is locked to the external clock signal ECLK. The internal clock signal ICLK is applied to the input buffers 109, 111, and 113 and the command decoder 115.

Figure 2:
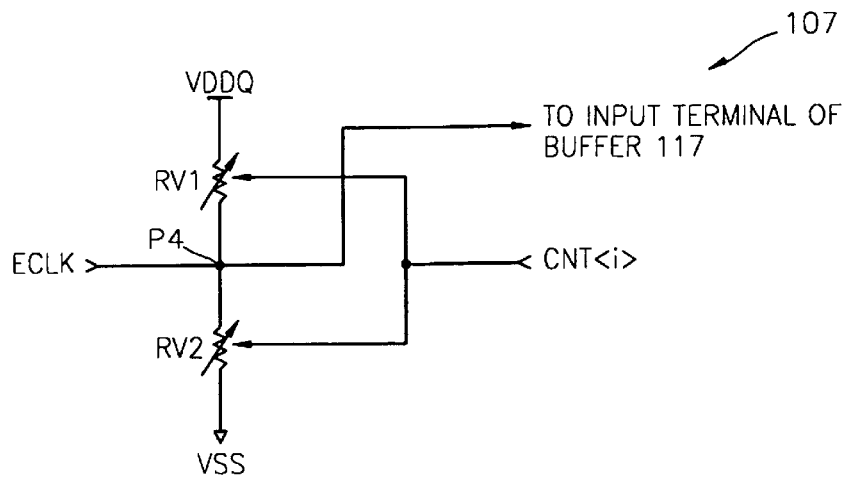
FIG. 2 is a circuit diagram illustrating in detail a variable resistance circuit of FIG. 1 according to an exemplary embodiment of the present invention.

FIG. 2 is a circuit diagram illustrating an exemplary implementation of the variable resistance circuit 107 of FIG. 1. Referring to FIG. 2, the variable resistance circuit 107 includes a first variable resistance RV1 connected to an external source voltage VDDQ, and a second variable resistance RV2 connected to the ground voltage VSS. Other variable resistance circuits 101, 103, and 105 may be implemented in the same manner as illustrated in FIG. 2 (and thus a description thereof is omitted) or in another manner known to one of ordinary skill in the art.

The resistance values of the first and second variable resistances RV1 and RV2 may vary according to process, voltage, and/or temperature variations. When power is applied to the memory device 100 and the external enable signal DLL_EN is enabled, the resistance values of the first and second variable resistances RV1 and RV2 are improved by a control signal CNT<i>, which is generated in the control circuit 120 by detecting the resistance value of the external reference resistance Rr. Consequently, the state of the termination P4 is also improved. In an exemplary embodiment, the improved resistance value is the external reference resistance Rr. In another exemplary embodiment, one or both of the first and second variable resistances RV1 and RV2 are varied to approach or match the external reference resistance Rr. In another exemplary embodiment, one or both of the first and second variable resistances RV1 and RV2 are varied to optimize the state of the termination (in the case, termination P4).

When the external clock signal ECLK is applied, the external clock signal ECLK, which has a low noise level, is input to the memory device 100. Consequently, the locking time for the DLL 119 is reduced. Similarly, other external signals DQ, ADDR, and CMD are applied after improving the state of the terminations P1, P2, and P3.

Referring to FIG. 1, the control circuit 120 generates the control signal CNT<i> for improving the resistance values included in the variable resistance circuits 101, 103, 105, and 107, in response to the external enable signal DLL_EN. After improving the state of the terminations P1, P2, P3, and P4 by using the control signal CNT<i>, an internal enable signal EN2 is generated for enabling the DLL 119. The enabled DLL 119 generates the internal clock signal ICLK locked to the external clock signal ECLK, which is buffered by the input buffer 117.

The control circuit 120 generates the control signal CNT<i> for improving the state of the terminations P1, P2, P3, and P4 while the memory device 100 performs an auto refresh operation, in response to a command enable signal CBR_EN that represents the activation of the auto refresh operation. Consequently, other operations of the memory device 100 are not affected. The auto refresh operation is a refresh operation performed by an internal address signal, not an external address signal, and is performed periodically while being controlled by a column address strobe (CAS) before row address strobe (RAS) or CAS before RAS (CBR) command.

Accordingly, the input/output characteristics of the memory device 100 are improved by receiving the external signals after improving the state of the terminations P1, P2, P3, and P4. In addition, the input/output characteristics of the memory device 100 are further improved by improving the state of the terminations during operation.

Figure 3:
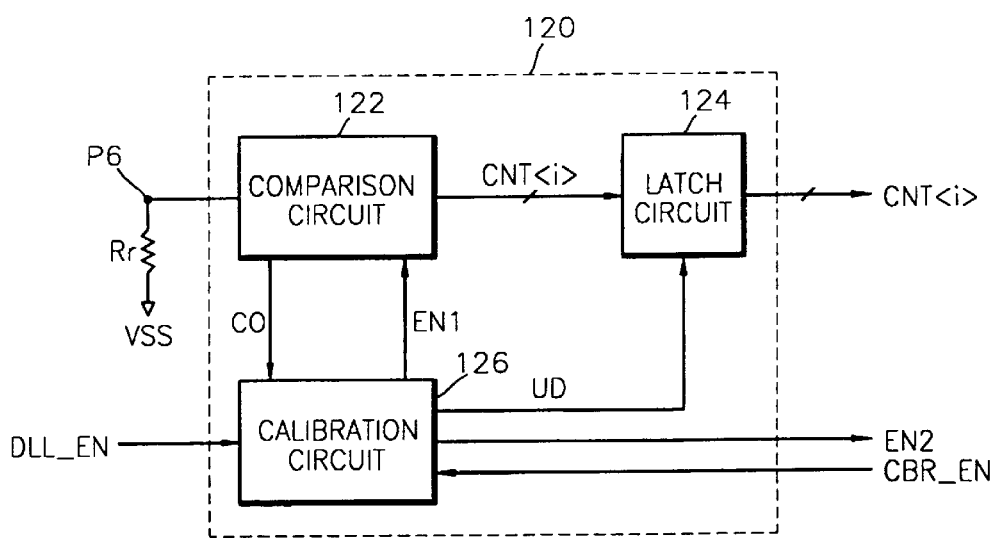
FIG. 3 is a block diagram schematically illustrating the structure of a control circuit shown in FIG. 1 according to an exemplary embodiment of the present invention.

FIG. 3 is a block diagram schematically illustrating an exemplary implementation of the control circuit shown in FIG. 1. Referring to FIG. 3, the control circuit 120 includes a comparison circuit 122, a latch circuit 124, and a calibration circuit 126.

The comparison circuit 122 generates the control signal CNT<i> after comparing the resistance values of the variable resistance circuits 101, 103, 105, and 107 with the external reference resistance Rr, in response to a first internal enable signal EN1. After the comparison, the comparison circuit 122 generates a completion signal CO.

The latch circuit 124 latches the control signal CNT<i>, and generates the latched control signal CNT<i> in response to an update signal UD.

The calibration circuit 126 generates the first internal enable signal EN1 for enabling the comparison circuit 122, in response to the external enable signal DLL_EN and the command enable signal CBR_EN. The calibration circuit 126 generates the update signal UD after receiving the completion signal CO and generates the second internal enable signal EN2 for activating the DLL 119 after the generation of the control signal CNT<i>.

If a calibration time tCAL, which is required for improving the states of the terminations P1, P2, P3, and P4 by the control signal CNT<i>, is less than a refresh time tRFC of the auto refresh operation, the state of the terminations P1, P2, P3, and P4 is improved within the refresh time tRFC.

If the calibration time tCAL is longer than the refresh time tRFC, the comparison circuit 122 is enabled during the first auto refresh operation of the auto refresh time, and the state of the terminations P1, P2, P3, and P4 is improved during a second auto refresh time, which is performed after the first auto refresh operation.

Figure 4:
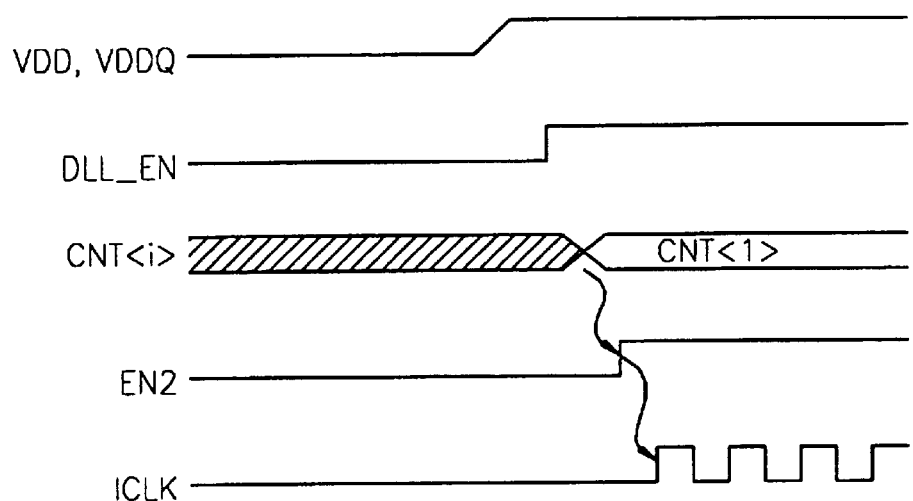
FIG. 4 is a timing diagram illustrating start of the operation of the memory device shown in FIG. 1 according to an exemplary embodiment of the present invention.

FIG. 4 is an exemplary timing diagram illustrating the start of the operation of the memory device shown in FIG. 1.

When the external source voltages VDD and VDDQ increase, the operation of the memory device 100 according to an exemplary embodiment of the present invention is started. When the external enable signal DLL_EN is activated, the control circuit 120 shown in FIG. 1 generates the control signal CNT<1> for improving the state of the terminations P1, P2, P3, and P4. When the second internal enable signal EN2 is activated, the DLL 119 is enabled for generating the internal clock signal ICLK. Namely, the memory device 100 according to an exemplary embodiment of the present invention receives the external signals after improving the state of the terminations P1, P2, P3, and P4.

Figure 5A:
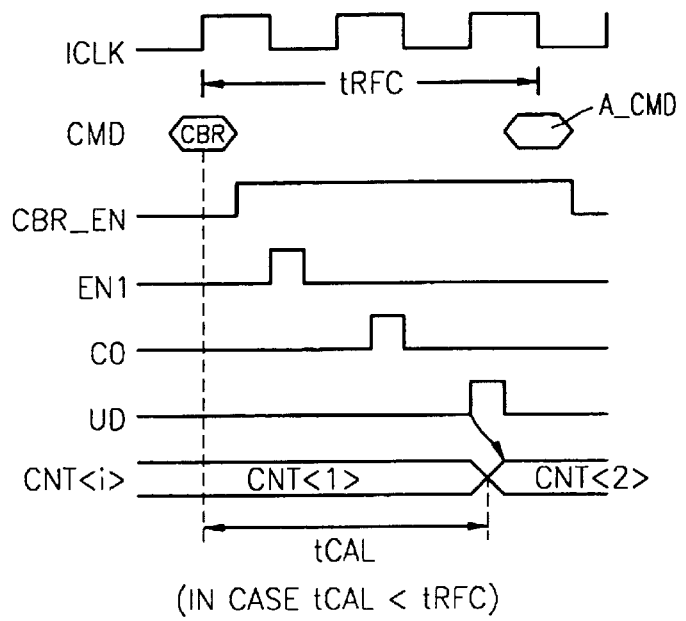
FIG. 5A is a timing diagram illustrating the operation of the control circuit during the operation of the memory device of FIG. 1 according to an exemplary embodiment of the present invention.

FIG. 5A is an exemplary timing diagram illustrating the operation of the control circuit 120 in the operation of the memory device 100 shown in FIG. 1. FIG. 5A represents an exemplary case where the calibration time tCAL is less than the refresh time tRFC. An external command signal A_CMD shown in FIG. 5A is the external command signal for controlling another operation, for example a writing operation, of the memory device 100 according to an exemplary embodiment of the present invention.

When a command signal CBR is generated by being locked to the internal clock signal ICLK, the command enable signal CBR_EN is activated. The first internal enable signal EN1, the completion signal CO, and the update signal UD are activated to generate an updated control signal CNT<2>. Accordingly, the state of the terminations P1, P2, P3, and P4 is improved by the updated control signal CNT<2>.

Figure 5B:
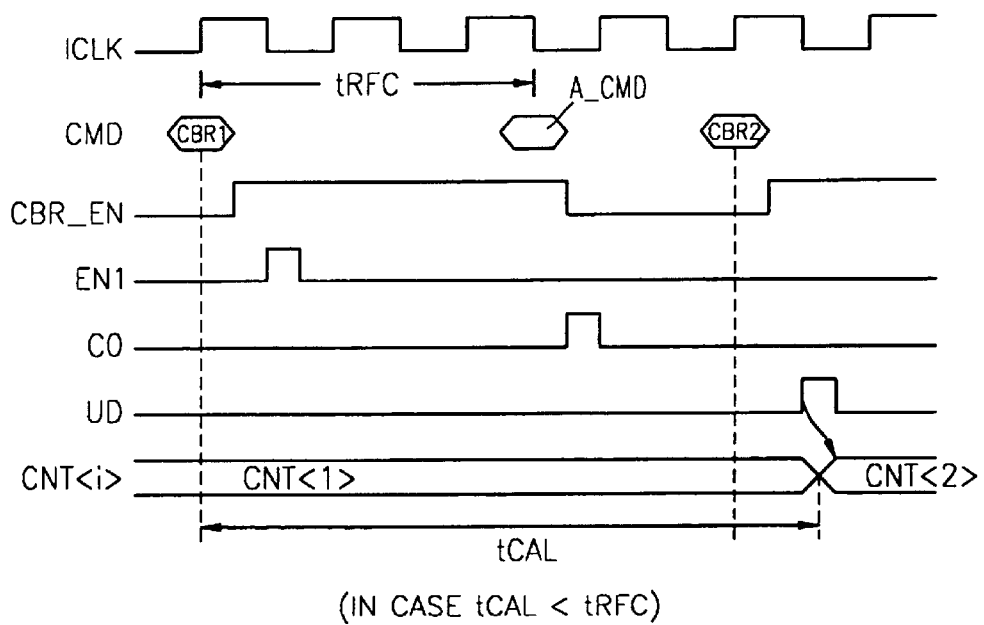
FIG. 5B is a timing diagram illustrating another operation of the control circuit during the operation of the memory device of FIG. 1 according to another exemplary embodiment of the present invention.

FIG. 5B is another exemplary timing diagram illustrating another operation of the control signal in the operation of the memory device 100 shown in FIG. 1. FIG. 5B represents an exemplary case where the calibration time tCAL is longer than the auto refresh time tRFC.

When a first command signal CBR1 is generated by being locked to the internal clock signal ICLK, the command enable signal CBR_EN is activated. When the first internal enable signal EN1 and the completion signal CO are activated, the latch circuit 124 stores a control signal CNT<2> for improving the state of the terminations P1, P2, P3, and P4. Thereafter, the memory device 100 according to an exemplary embodiment of the present invention performs other operations by receiving the external command A_CMD locked to the internal clock signal ICLK. When a second command signal CBR2 locked to the internal clock signal ICLK is generated, the update signal UD is activated. Then, the control signal CNT<2> for improving the state of the terminals P1, P2, P3, and P4 is applied to the variable resistance circuits 101, 103, 105, and 107.

As described above, in one or more of the exemplary embodiments of the present invention, the state of at least one termination is improved by the control signal by varying one or more variable resistance circuits to approach or match a reference resistance. It is further noted that the at least one termination may also be optimize by such a technique. Additionally, as described above, the state of at least one termination may be improved or optimized while the memory device performs an auto refresh operation. However, the state of at least one termination may be improved or optimized while the memory device performs any other operation, as would be known to one of ordinary skill in the art.

Still further, while exemplary numbers of elements have been described, these numbers are provided by way of illustration only. For example, the number of variable resistance circuits, input buffers, terminations, external signals, enable signals and variable resistances may be varied form the numbers described above as would be evident to one of ordinary skill in the art. Further, in general, while this invention has been particularly shown and described with reference to exemplary embodiments thereof, it will be understood by those skilled in the art that various changes in form and details, such as those suggested above, may be made throughout without departing from the spirit and scope of the invention as defined by the appended claims.

What is claimed is:

1. A memory device including a delay locked-loop circuit (DLL), the memory device comprising:
   at least one termination to which at least one variable resistance circuit is connected and through which at least one external signal is passed for operating the memory device; and
   a control circuit for generating a control signal for controlling at least on resistance value of the at least one variable resistance circuit, in response to a command enable signal that represents the activation of another operation and an external enable signal that activates the DLL in the memory device,
   wherein the DLL is enabled after a state of the at least one termination is improved by the control signal, and the state of the at least one termination is improved by the control signal while the memory device periodically performs the another operation.

2. The memory device of claim 1, wherein the state of the at least one termination is optimized by the control signal while the memory device periodically performs the another operation.

3. The memory device of claim 1, wherein the another operation is an auto refresh operation.

4. The memory device of claim 3, wherein the control circuit includes:
   a comparison circuit for generating the control signal by comparing the at least one resistance value of the at least one variable resistance circuit with an external reference resistance value that is a reference for improving the state of the at least one termination, and for generating a completion signal after comparing;
   a latch circuit for latching the control signal to generate a latched control signal in response to an update signal; and
   a calibration circuit for generating a first internal enable signal to enable the comparison circuit in response to the external enable signal and the command enable signal, for generating the update signal after receiving the completion signal, and for generating a second internal enable signal to activate the DLL after generating the control signal,
   wherein if a calibration time required for improving the state of the at least one termination by the control signal is less than a refresh time for the auto refresh operation, the state of the at least one termination is improved within the refresh time, and
   if the calibration time is longer than the refresh time, the comparison circuit is enabled while performing a first auto refresh operation of the auto refresh operation, thereby improving the state of the at least one termination while performing a second auto refresh operation performed after the first auto refresh operation.

5. The memory device of claim 1, wherein the at least one variable resistance circuit includes at least two variable resistances, a first variable resistance connected to an external source voltage, wherein a value of the first variable resistance may be modified to approach or match an external reference resistance value in response to the control signal; and a second variable resistance connected to a ground voltage, wherein a value of the second variable resistance may be modified to approach or match the external reference resistance value in response to the control signal.

6. A process for improving the state of at least on termination in a memory device comprising:
   connecting at least one termination to which at least one variable resistance circuit is connected and passing at least one external signal through the at least one termination and the at least one variable resistance circuit for operating the memory device;
   generating a control signal for controlling at least one resistance value of at least one variable resistance circuit, in response to a command enable signal that represents the activation of another operation and an external enable signal that activates a delay locked-loop circuit (DLL) in the memory device; and
   improving the state of the at least one termination in the memory device based on the control signal;
   wherein the DLL is enabled after the state of the at least one termination is improved by the control signal, and the state of the at least one termination is improved by the control signal while the memory device periodically performs the another operation.

7. The process of claim 6, wherein the state of the at least one termination is optimized by the control signal while the memory device periodically performs the another operation.

8. The process of claim 6, wherein the another operation is an auto refresh operation.

9. The process of claim 8, wherein generating the control signal includes:
   comparing the at least one resistance value of the at least one variable resistance circuit with an external reference resistance value that is a reference for improving the state of the at least one termination,
   generating a completion signal after comparing;
   latching the control signal to generate a latched control signal in response to an update signal;
   generating a first internal enable signal to enable the comparison circuit in response to the external enable signal and the command enable signal,
   generating the update signal after receiving the completion signal, and
   generating a second internal enable signal to activate the DLL after generating the control signal,
   wherein if a calibration time required for improving the state of the at least one termination by the control signal is less than a refresh time for the auto refresh operation, the state of the at least one termination is improve within the refresh time, and
   if the calibration time is longer than the refresh time, the comparison is enabled while performing a first auto refresh operation of the auto refresh operation, thereby improving the state of the at least one termination while performing a second auto refresh operation performed after the first auto refresh operation.

10. The process of claim 6, wherein the at least one variable resistance circuit includes at least two variable resistances, and wherein the improving includes
    modifying a value of the first variable resistance, connected to an external source voltage, to approach or match an external reference resistance value in response to the control signal; and
    modifying a second variable resistance, connected to a ground voltage, to approach or match the external reference resistance value in response to the control signal.

11. A process for improving the state of at least one termination in a memory device comprising:

generating a control signal for controlling at least one resistance value of at least one variable resistance circuit, in response to a command enable signal that represents the activation of another operation and an external enable signal that activates a delay locked-loop circuit (DLL) in the memory device; and improving the state of the at least one termination in the memory device based on the control signal;

wherein the DLL is enabled after the state of the at least one termination is improved by the control signal, and the state of the at least one termination is improved by the control signal while the memory device periodically performs the another operation, wherein the state of the at least one termination is optimized by the control signal while the memory device periodically performs the another operation;

wherein the another operation is an auto refresh operation;

wherein generating the control signal includes:
  comparing the at least one resistance value of the at least one variable resistance circuit with an external reference resistance value that is a reference for improving the state of the at least one termination, generating a completion signal after comparing;

latching the control signal to generate a latched control signal in response to an update signal;

generating a first internal enable signal to enable the comparison circuit in response to the external enable signal and the command enable signal, generating the update signal after receiving the completion signal, and generating a second internal enable signal to activate the DLL after generating the control signal;

wherein if a calibration time required for improving the state of the at least one termination by the control signal is less than a refresh time for the auto refresh operation, the state of the at least one termination is improved within the refresh time, and if the calibration time is longer than the refresh time, the comparison is enabled while performing a first auto refresh operation of the auto refresh operation, thereby improving the state of the at least one termination while performing a second auto refresh operation performed after the first auto refresh operation.

* * * * *